(12) United States Patent
Goto et al.

(10) Patent No.: US 7,585,777 B1
(45) Date of Patent: *Sep. 8, 2009

(54) PHOTORESIST STRIP METHOD FOR LOW-K DIELECTRICS

(75) Inventors: Haruhiro Harry Goto, Saratoga, CA (US); Ilia Kalinovski, Berkeley, CA (US); Khalid Mohamed, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/859,727

(22) Filed: Sep. 21, 2007

Related U.S. Application Data

(63) Continuation of application No. 10/890,653, filed on Jul. 13, 2004, now Pat. No. 7,288,484.

(51) Int. Cl.
*H01L 21/302* (2006.01)
*H01L 21/461* (2006.01)

(52) U.S. Cl. .................. 438/710; 438/711; 438/725; 257/E21.218; 257/E21.311

(58) Field of Classification Search .............. 438/710, 438/711, 725, 637, 638; 257/E21.579, E21.218, 257/E21.311
See application file for complete search history.

(56) References Cited

U.S. PATENT DOCUMENTS

| | | | |
|---|---|---|---|
| 4,357,203 A | 11/1982 | Zelez | |
| 5,122,225 A | 6/1992 | Douglas | |
| 5,292,393 A | 3/1994 | Maydan et al. | |
| 5,660,682 A | 8/1997 | Zhao et al. | |
| 5,811,358 A | 9/1998 | Tseng et al. | |
| 5,814,155 A | 9/1998 | Solis et al. | |
| 5,980,770 A | 11/1999 | Ramachandran et al. | |
| 6,129,091 A | 10/2000 | Lee et al. | |
| 6,130,166 A | 10/2000 | Yeh | |
| 6,184,134 B1 | 2/2001 | Chaudhary et al. | |
| 6,204,192 B1 | 3/2001 | Zhao et al. | |
| 6,277,733 B1 * | 8/2001 | Smith .................... 438/636 | |
| 6,281,135 B1 | 8/2001 | Han et al. | |
| 6,306,564 B1 | 10/2001 | Mullee | |
| 6,342,446 B1 | 1/2002 | Smith et al. | |
| 6,426,304 B1 | 7/2002 | Chien et al. | |
| 6,465,964 B1 | 10/2002 | Taguchi et al. | |
| 6,555,472 B2 * | 4/2003 | Aminpur .................. 438/669 | |

(Continued)

OTHER PUBLICATIONS

Kikuchi et al., Native Oxide Removal on Si Surfaces by NF3-Added Hydrogen and Water Vapor Plasma Downstream Treatment, Jpn J. Appl. Phys. vol. 33 (1994), pp. 2207-2211, Part 1, No. 4B, Apr. 1994.

(Continued)

*Primary Examiner*—Michelle Estrada
(74) *Attorney, Agent, or Firm*—Weaver Austin Villeneuve & Sampson LLP

(57) ABSTRACT

The present invention pertains to methods for removing unwanted material from a semiconductor wafer during wafer manufacturing. More specifically, the invention pertains to stripping photo-resist material and removing etch-related residues from a semiconductor wafer. Methods involve implementing a plasma operation using hydrogen and a weak oxidizing agent, such as carbon dioxide. The invention is effective at stripping photo-resist and removing residues from low-k dielectric material used in Damascene devices.

20 Claims, 9 Drawing Sheets

U.S. PATENT DOCUMENTS

| | | | |
|---|---|---|---|
| 6,638,875 | B2 | 10/2003 | Han et al. |
| 6,680,164 | B2 | 1/2004 | Nguyen et al. |
| 6,720,132 | B2 * | 4/2004 | Tsai et al. .................. 430/312 |
| 7,202,176 | B1 | 4/2007 | Goto et al. |
| 7,288,484 | B1 | 10/2007 | Goto et al. |
| 7,390,755 | B1 | 6/2008 | Chen et al. |
| 2002/0090827 | A1 | 7/2002 | Yokoshima |
| 2002/0185151 | A1 | 12/2002 | Qingyuan et al. |
| 2002/0197870 | A1 | 12/2002 | Johnson |
| 2005/0079723 | A1 | 4/2005 | Niimi et al. |
| 2006/0191478 | A1 | 8/2006 | Gondhalekar et al. |
| 2007/0179698 | A1 | 8/2007 | Okita et al. |
| 2008/0026589 | A1 | 1/2008 | Hubacek et al. |

OTHER PUBLICATIONS

Woody K. Chung, "Downstream Plasma Removal of Mobile Ion Impurity From $SIO_2$," Published Proceedings of the $8^{th}$ International Plasma Processing Symposium, Fall 1990, 7 pages.

Woody K, Chung, "Low Damage, Downstream RF Plasma Ashing of High Energy, Heavily Doped Implanted Resists," Semicon Korea, Dec. 1989.

A. Kalnitsky and W. K. Chung, "Characterization and Optimization of a Single Wafer Downstream Plasma Stripper," Journal of the Electrochemical Society, vol. 135, No. 9, Sep. 1988, pp. 2338-2341.

Goto et al., "Enhanced Stripping of Low-K Films Using Downstream Gas Mixing," Novellus Systems, Inc., U.S. Appl. No. 11/712,253, filed Feb. 27, 2007, pp. 1-28.

U.S. Office Action for U.S. Appl. No. 10/890,653 mailed Jul. 27, 2005.

U.S. Final Office Action for U.S. Appl. No. 10/890,653 mailed Jan. 10, 2006.

U.S. Office Action for U.S. Appl. No. 10/890,653 mailed Jun. 26, 2006.

U.S. Office Action for U.S. Appl. No. 10/890,653 mailed Oct. 11, 2006.

U.S. Office Action for U.S. Appl. No. 10/890,653 mailed Apr. 5, 2007.

Notice of Allowance for U.S. Appl. No. 10/890,653 mailed Jun. 15, 2007.

Notice of Allowance for U.S. Appl. No. 11/011,273 mailed Nov. 28, 2006.

U.S. Office Action for U.S. Appl. No. 11/712,253 mailed Dec. 23, 2008.

U.S. Office Action for U.S. Appl. No. 10/137,096 mailed Jul. 11, 2003.

U.S. Office Action for U.S. Appl. No. 10/137,096 mailed Jul. 27, 2007.

Notice of Allowance for U.S. Appl. No. 10/137,096 mailed Jan. 15, 2008.

U.S. Office Action for U.S. Appl. No. 12/111,095 mailed Aug. 25, 2008.

Notice of Allowance for U.S. Appl. No. 12/111,095 mailed Apr. 3, 2009.

* cited by examiner

PHOTORESIST STRIP METHOD FOR LOW-K DIELECTRICS

CROSS-REFERENCE TO RELATED APPLICATIONS

The present application is a continuation of and claims priority to co-pending U.S. patent application Ser. No. 10/890,653, filed Jul. 13, 2004, which is incorporated herein by reference in its entirety.

BACKGROUND

The present invention pertains to methods for stripping photo-resist material and removing etch-related residues from the surface of a partially fabricated integrated circuit in preparation for further processing. More specifically, the invention pertains to methods for implementing a plasma operation using hydrogen and a weak oxidizing agent such as carbon dioxide. The invention is effective at efficiently stripping photo-resist and removing residues from low-k dielectric layers after etching processes used in Damascene devices.

Damascene processing techniques are often preferred methods in many modern integrated circuit manufacturing schemes because it requires fewer processing steps and offers a higher yield than other methods. Damascene processing involves forming metal conductors on integrated circuits by forming inlaid metal lines in trenches and vias in a dielectric layer (inter-metal dielectric). As part of the Damascene process, a layer of photoresist is deposited on a dielectric layer. The photoresist is a light-sensitive organic polymer which can be "spun on" in liquid form and dries to a solid thin film. The photosensitive photoresist is then patterned using light through the mask and wet solvent. A plasma etching process (dry etch) is then used to etch exposed portions of dielectric and transfer the pattern into the dielectric, forming vias and trenches in the dielectric layer.

Once the dielectric layer is etched, the photoresist must be stripped and any etch-related residues must be thoroughly removed before subsequent processing to avoid embedding impurities in the device. Conventional processes for stripping photoresist employ a plasma formed from a mixture of gases with the presence of oxygen in the plasma. The highly reactive oxygen based plasma reacts with and oxidizes the organic photoresist to form volatile components that are carried away from the wafer surface.

Highly oxidizing conditions are also generally unsuitable for use on low dielectric constant (low-k) materials. Low-k materials have been used as inter-metal and/or inter-layer dielectrics between conductive interconnects in many modern devices to reduce the delay in signal propagation due to capacitive effects. The lower the dielectric constant of the dielectric material, the lower the capacitance of the dielectric and the lower the RC delay of the integrated circuit. Typically, low-k dielectrics are silicon-oxide based materials with some amount of incorporated carbon, commonly referred to as carbon doped oxide (CDO). It is believed, although not necessarily proven, that the oxygen scavenges or removes carbon from the low-k materials. In many of these materials such as CDOs, the presence of carbon is instrumental in providing a low dielectric constant. Hence, to the extent that the oxygen removes carbon from these materials, it effectively increases the dielectric constant. As processes used to fabricate integrated circuits moves toward smaller and smaller dimensions and requires the use of dielectric materials having lower and lower dielectric constants, it has been found that the conventional strip plasma conditions are not suitable.

To solve these issues, others have reported using hydrogen based plasmas with inert gases or alternative strong oxidizing agents to strip the photoresist. Han et al (U.S. Pat. Nos. 6,281,135 and 6,638,875) describe using a mixture of hydrogen, helium and fluorine and Zhao et al (U.S. Pat. Nos. 5,660,682 and 6,204,192) describe using a mixture of hydrogen and argon. The hydrogen based plasmas without oxidizing agents, however, have very low strip rates and may not effectively remove the myriad of organic contaminants found on the wafer after etching.

What is needed therefore are improved and more efficient methods for stripping photoresist and etch-related materials from dielectric materials, especially from low-k dielectric materials.

SUMMARY OF THE INVENTION

The present invention addresses the aforementioned need by providing improved methods for stripping photoresist and removing etch-related residues from dielectric materials. In one aspect of the invention, methods involve removing material from a dielectric layer after an etch process according to the following sequence of operations: (a) placing a partially fabricated integrated circuit in a reaction chamber, (b) introducing gas comprising a weak oxidizing agent and hydrogen into the reaction chamber, and (c) applying RF power to form a plasma within the reaction chamber to convert at least a portion of the material to gaseous form, thereby removing at least a portion of the material from the partially fabricated integrated circuit. As stated previously, methods may be used to remove photoresist and/or residues from the etch process. Methods may be effectively implemented on Damascene devices, including single and dual Damascene devices.

In preferred embodiments, the weak oxidizing agent comprises at least one of carbon dioxide, carbon monoxide, nitrous oxide, nitric oxide and nitrogen dioxide and water. In a particularly preferred embodiment, the weak oxidizing agent comprises carbon dioxide. In preferred embodiments where carbon dioxide is used, the gas comprises between about 0.1% to about 1.0% carbon dioxide by volume. In some embodiments, the gas further comprises at least one inert carrier gas such as helium, argon or nitrogen. In preferred embodiments, the gas does not comprise molecular oxygen.

Methods of the invention may be implemented on any size wafer. Most modern wafer fabrication facilities use either 200 mm or 300 mm wafers. Process conditions may vary depending upon the wafer size. If a 300 mm wafer is used, the total flow rate of gas will preferably range between about 1,000 sccm and about 40,000 sccm. If carbon dioxide is used as the weak oxidizing agent, the flow rate of carbon dioxide will preferably range between about 1 sccm and about 400 sccm. Typically, the RF plasma power for a 300 mm wafer ranges between about 300 Watts to about 3 Kilowatts for a direct plasma. Methods may be implemented using a direct or downstream plasma. In some embodiments of the invention, it is desired to keep the work piece at a particular temperature during the application of plasmas to its surface. Preferred wafer temperatures can range between about 220 degrees and about 400 degrees Celsius. Preferred chamber pressures can range between about 300 mTorr and about 2 Torr. In some embodiments, the wafer is held at a bias.

As mentioned previously, methods of the invention may be used with low-k dielectric materials, including carbon-doped low-k dielectric materials such as carbon-doped oxides (CDOs). Methods of the invention can be implemented on both non-porous and porous dielectric materials, including CDOs and other compositions.

Methods of the invention may be implemented in any suitable reaction chamber. The reaction chamber may be one chamber of a multi-chambered apparatus or it may be part of a single chamber apparatus. In some embodiments of the invention, after applying RF power to form a plasma within the reaction chamber to convert at least a portion of the material to gaseous form (operation (c)), methods then involve (d) removing the partially fabricated integrated circuit from the reaction chamber, and (e) performing a cleaning process on the partially fabricated integrated circuit to remove any remaining material from the dielectric layer. In typical applications, a wet cleaning process is used. Some typical wet cleaning processes involve exposing the partially fabricated integrated circuit to an acidic or basic solution. Other typical wet cleaning processes involve exposing the partially fabricated integrated circuit to deionized water. Some wet cleaning processes involve using organic solvents, with or without the presence of acids or bases.

These and other features and advantages of the present invention will be described in more detail below with reference to the associated drawings.

DETAILED DESCRIPTION OF THE PREFERRED EMBODIMENTS

Introduction

Figure 1:
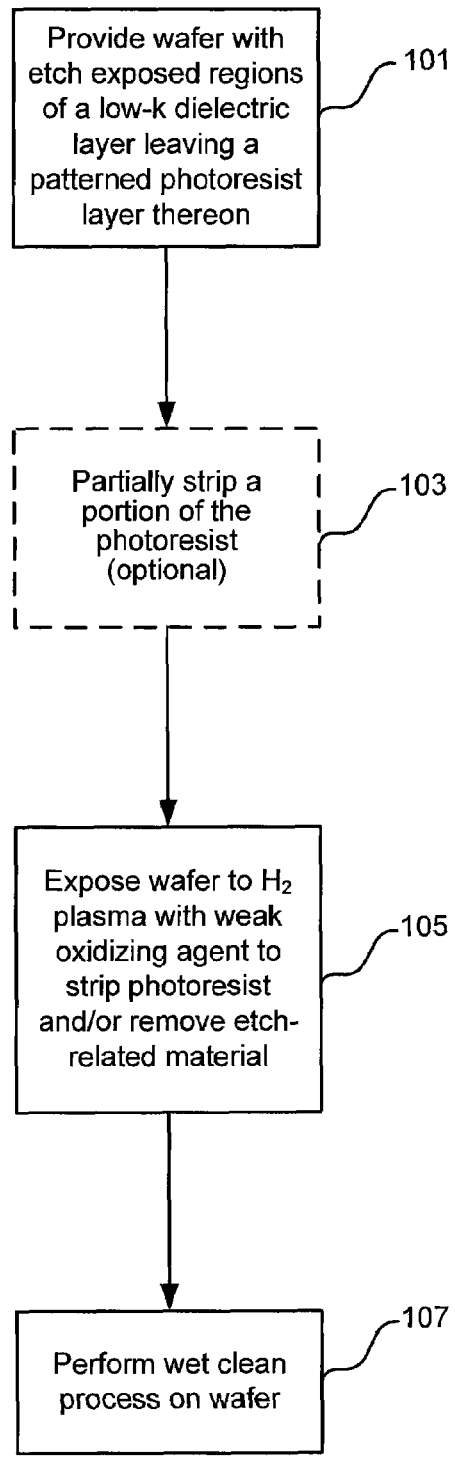
FIG. 1 is a process flow diagram illustrating aspects of some embodiments of the invention employed for stripping photoresist and removing etch-related residue from a partially fabricated integrated circuit.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the terms "semiconductor wafer", "wafer" and "partially fabricated integrated circuit" will be used interchangeably. One skilled in the art would understand that the term "partially fabricated integrated circuit" can refer to a silicon wafer during any of many stages of integrated circuit fabrication thereon. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

As mentioned previously, methods of the invention may be used to efficiently and effectively to remove photoresist and etch-related materials from a low-k dielectric materials. Methods of the invention are not limited to low-k dielectrics. Methods are also not limited to any particular category of low-k dielectrics. For instance, described methods may be effectively used on dielectrics with k values less than 4.0 ("first generation" low-k dielectrics), dielectrics with k values less than about 2.8 ("second generation" low-k dielectrics) and dielectrics with k values less than about 2.0 ("ultra-low-k" dielectrics). The low-k dielectric may be porous or non-porous (sometimes referred to as a "dense" low-k dielectric). Generally, low-k dense dielectrics are those having k values no greater than 2.8 and low-k porous dielectrics are those having k values no greater than 2.2. Low-k dielectrics of any suitable composition may be used, including silicon oxide based dielectrics doped with fluorine and/or carbon. Non-silicon oxide based dielectrics, such as polymeric materials, may also be used. Any suitable process may be used to deposit the low-k dielectric, including as spin-on deposit and CVD deposit techniques. In the case of forming porous dielectrics, any suitable method may be used. A typical method involves co-depositing a silicon-based backbone and an organic porogen and subsequently removing the porogen component, leaving a porous dielectric film. Other methods include sol-gel techniques. Specific examples of suitable low-k films are carbon based spin-on type films such as SILK™ and CVD deposited porous films such as Coral™.

Methods of the invention use plasmas that are produced from gases that contain hydrogen and a weak oxidizing agent. One skilled in the art will recognize that the actual species present in the plasma may be a mixture of different ions and molecules derived from the hydrogen and/or weak oxidizing agent. It is noted that other species may be present in the reaction chamber, such as small hydrocarbons, carbon dioxide, water vapor and other volatile components as the plasma reacts with and breaks down the organic photoresist and other residues. One of skill in the art will also recognize that reference to the initial gas/gases introduced into the plasma is/are different from other gas/gases that may exist after the plasma is formed.

Process

FIG. 1 is a flow chart depicting one general high-level process flow in accordance with some embodiments of the present invention. Note that some typical operations related to the methods of the invention involved in integrated circuit (IC) fabrication are also included in FIG. 1 to provide a context for how the invention may be used. To provide a visual context of some embodiments of the invention, FIGS. 2A through 2C show cross-sectional depictions of a portion of a low-k Damascene device during various pertinent fabrication processes.

Referring to FIG. 1, a wafer with exposed regions of a low-k dielectric layer are etched leaving a patterned photoresist layer thereon is provided (block 101). FIGS. 2A and 2B depict the forming of a patterned low-k dielectric in the context of processing a Damascene device 200. FIG. 2A shows device 200 before and FIG. 2B shows device 200 after a dry etch process. FIG. 2B corresponds to the state of the device provided in block 101 of FIG. 1.

Figure 2A:
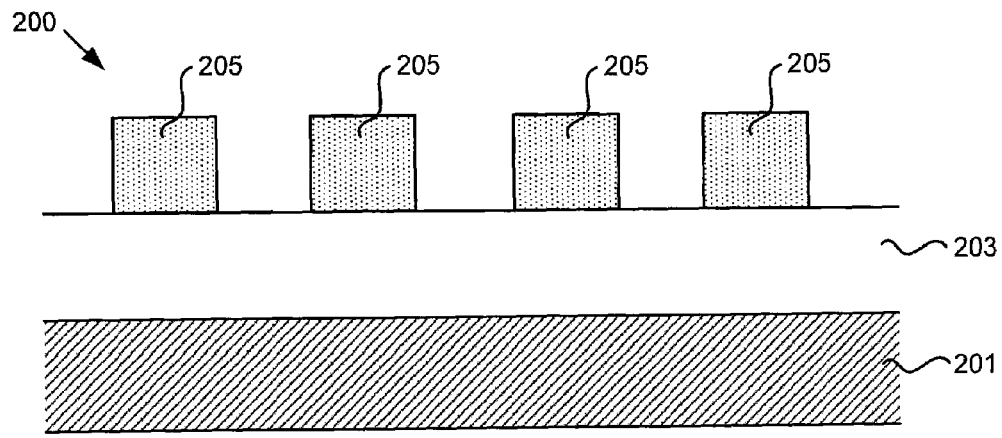
FIGS. 2A-2C show cross sectional depictions of a low-k Damascene device during dry etch and photoresist strip processes in accordance with the invention.

Referring to FIG. 2A, copper layer 201 has a low-k dielectric layer 203 deposited thereon, which has portions of photoresist 205 deposited thereon. Note that if device 200 was a dual Damascene device, copper layer 201 would be lower layers of patterned copper interconnect. Photoresist 205 was previously patterned using UV light lithography (or other suitable process) to leave exposed portions of low-k dielectric layer 203. Device 200 is then subjected to a dry etch process, typically one of sputter etching, plasma etching or reactive ion etching.

Figure 2B:
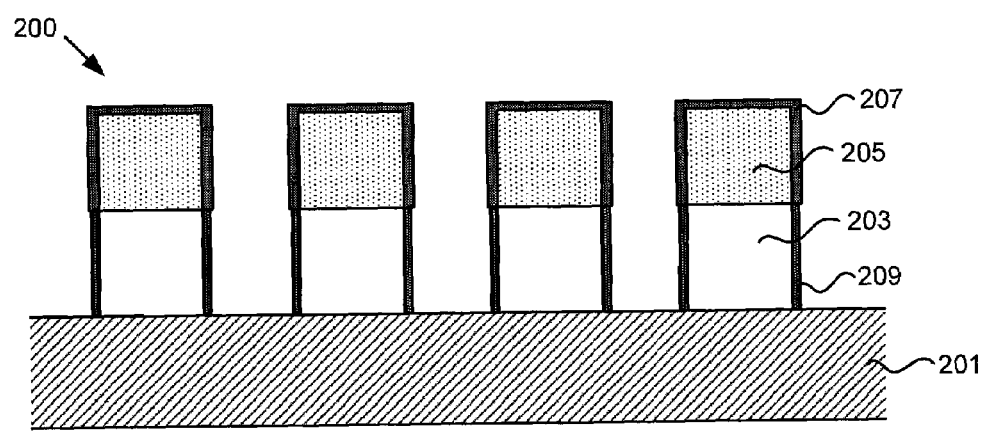
Figure 2C:
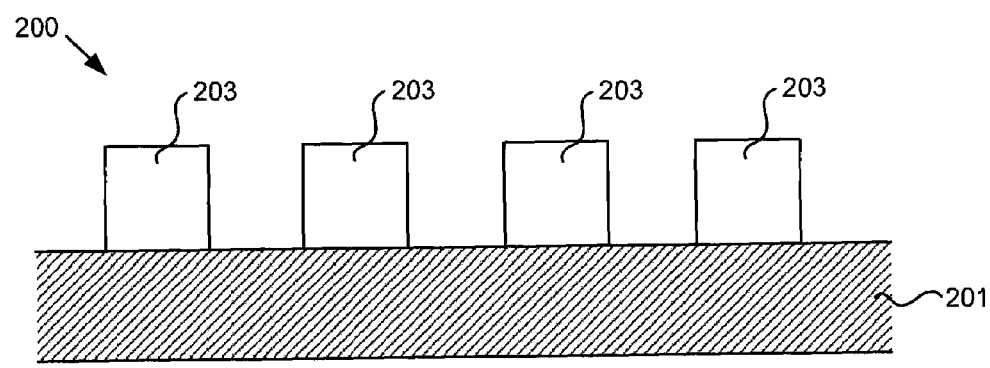

As shown in FIG. 2B, after the dry etch process, the resulting device 200 has via 211 and trench 213 etched within low-k dielectric layer 203. Photoresist portions 205 must be stripped before further wafer processing. Note that the tops and sides of the exposed photoresist portions 205 have "skins" 207 that are relatively hard portions of the photoresist as a result of some dry etch processes and that can be compositionally different from the bulk photoresist portions 205. The skin is typically composed of dielectric residues re-deposited from low-k dielectric 203 and re-deposited polymer residue from the photoresist 205. In addition to the skin, a film 209 can also form over exposed sidewalls of low dielectric 203. This film typically consists of polymer residues and damaged portions of the low-k dielectric from ion bombardment during the dry etch process.

Referring back to FIG. 1, the photoresist may then optionally be stripped of a portion of the photoresist (block 103). This partial strip operation is typically mainly used to remove the skin that was formed from the etch process and is generally tougher to remove. The use of this partial strip operation will depend on the particular device applications and other process considerations. If it is performed, it is typically done in the same reaction chamber in which the etch took place and will typically involve a low temperature oxygen containing plasma. It is noted, however, that this oxidizing partial strip operation can damage some low-k dielectric materials (i.e., deplete the carbon content as described previously) and, depending on the application, it may not be implemented.

Referring again to FIG. 1, the next operation is to expose the wafer to a hydrogen based plasma with a weak oxidizing agent to strip the photoresist and/or remove etch-related material (block 105). This process is typically performed in a different reaction chamber from the chamber where the etch took place (block 101). Such reaction chamber may be referred to as a stand-alone "strip unit." Any apparatus with suitable plasma reaction chamber can be used. The system may provide a direct (in situ plasma) or downstream plasma. Examples of suitable apparatuses are the Novellus Gamma™ 2100 and Gamma™ 2130 systems.

Although not wishing to be bound to theory, it is believed that the hydrogen component of the plasma can not only serve to create hydrogen radicals to help remove residues but can also reduce unwanted copper oxides at the bottoms of vias and trenches and passivate the copper. As discussed previously, however, hydrogen gas alone or with other non-oxidizing agents has previously been implemented to strip photoresist without the deleterious effects of using oxygen but these techniques have greatly diminished strip rates. The present invention improves on these methods by the addition of a weak oxidizing agent. The weak oxidizing agent adds a slightly more reactive nature to the plasma compared to a hydrogen only plasma while avoiding highly aggressive oxidizing conditions.

In a preferred embodiment, the plasma is produced by first introducing hydrogen (with or without a carrier gas) and the weak oxidizing agent into the reaction chamber and exposing the mixture to conditions that form a plasma from the gas mixture. Any weak oxidizing agent can be used. Examples include carbon oxides such as carbon dioxide ($CO_2$), carbon monoxide (CO), nitrogen oxides such as nitrous oxide ($N_2O$), nitric oxide (NO), nitrogen dioxide ($NO_2$), and sulfur oxides such as sulfur oxide (SO) and sulfur dioxide ($SO_2$). Examples of other weak oxides include any oxygen containing hydrocarbons ($C_xH_yO_z$) and water ($H_2O$). A particularly preferred weak oxidizing agent because it is cheap, safe, and effective is carbon dioxide.

The total flow rate of gas, the relative amount of weak oxidizing agent and other conditions in the strip chamber can vary depending upon, among other factors, plasma type (downstream versus direct), RF power, chamber pressure, substrate (wafer) size and type of weak oxidizing agent used. In some examples using the Novellus Gamma™ 2130 system (downstream plasma system), the plasma will preferably comprise between about 0.1% to about 1.0% carbon dioxide by volume. Based on a 300 mm wafer in the Novellus Gamma™ 2130 system, the total flow rate of gas will preferably range between about 1,000 sccm and about 40,000 sccm with the flow rate of carbon dioxide will preferably range between about 1 sccm and about 400 sccm and the RF power will preferably range between about 300 Watts to about 3 Kilowatts. Chamber pressures will typically range between about 300 mTorr and about 2 Torr, preferably between about 800 mTorr and about 1.6 Torr.

In addition to hydrogen and weak oxidizing agent, a carrier gas such as helium, argon or nitrogen may be used. The carrier gas will preferably be an unreactive gas. For shipment and handling safety reasons, commercial hydrogen is available in mixtures with noble gases such as helium. These commercially available gas mixtures may be used for the methods of this invention. It is noted, however, as shown by the data presented below in the Experimental section, superior results were found when pure hydrogen without carrier gas was used. In addition, since it was found that even small amounts of oxygen gas added to the plasma may have damaging effects on the low-k dielectric, in preferred embodiments no oxygen gas is added.

The wafer is typically temperature controlled during exposure to the plasma. For Damascene devices the upper limit temperature is typically around 400 degrees Celsius. Preferred wafer temperatures for the present invention will typically range between about 220 degrees and about 400 degrees Celsius, depending upon other process conditions. For the Novellus Gamma™ 2130 system, this preferred wafer temperature range corresponds to platen temperatures of about 250 degrees to about 400 degrees Celsius. In preferred embodiments, the wafer is electrically grounded. In some instances, however, it may be preferable to apply a bias to the wafer.

Returning to FIG. 1, after the majority of the photoresist and etch residue has been removed during plasma strip, it may be preferable to further clean the wafer of any remaining residues that may exist on the wafer using a wet clean process 107. The implementation of this post-strip cleaning process will depend upon particular device application and process needs. In typical cases, this cleaning process is a wet cleaning process involving either an acidic or basic solution. In some cases, the wet cleaning process is simply a deionized water cleaning process. Some wet cleaning processes involve the use of organic additives. After the wet clean has been performed, the flow chart of FIG. 1 is complete. From there, the surface of the partially fabricated integrated circuit is ready to have a diffusion barrier deposited on it and the process flows in a conventional Damascene manner.

Experimental

As mentioned previously, the present invention is effective at efficiently stripping photo-resist and removing residues from low-k dielectric layers after etching processes. Processes of the invention are generally performed in a manner that optimizes at least four parameters. These are: 1) having an effectively fast strip rate, 2) producing a relatively small amount of residual photoresist at the end of the strip process, 3) minimizing the increase in dielectric constant during the strip, and 4) minimizing the damage to the resulting dielectric structure at the end of the strip process. It has been found that the use of carbon dioxide greatly improves the first two parameters, 1) and 2). The last two parameters, 3) and 4), are the direct chemical impact of the plasma on the dielectric material that has been etched.

FIGS. 3A through 3G are graphs presenting data regarding the aforementioned four parameters for sample wafers processed using methods of the invention. All wafers were 300 mm sized wafers processed (i.e., photoresist stripped) on a six wafer station Novellus Gamma™ 2130 tool which is configured with a downstream plasma setup. All wafers had about 4,500 Angstroms of blanket Coral™ film (a dense carbon doped oxide film) deposited thereon. Note that experimental results for these specific examples are shown to clarify and illustrate the effectiveness of methods of the invention and are not meant to limit the invention to any particular embodiments. For example, results on different types of devices may suggest that different embodiments of the invention may be preferred.

Figure 3A:
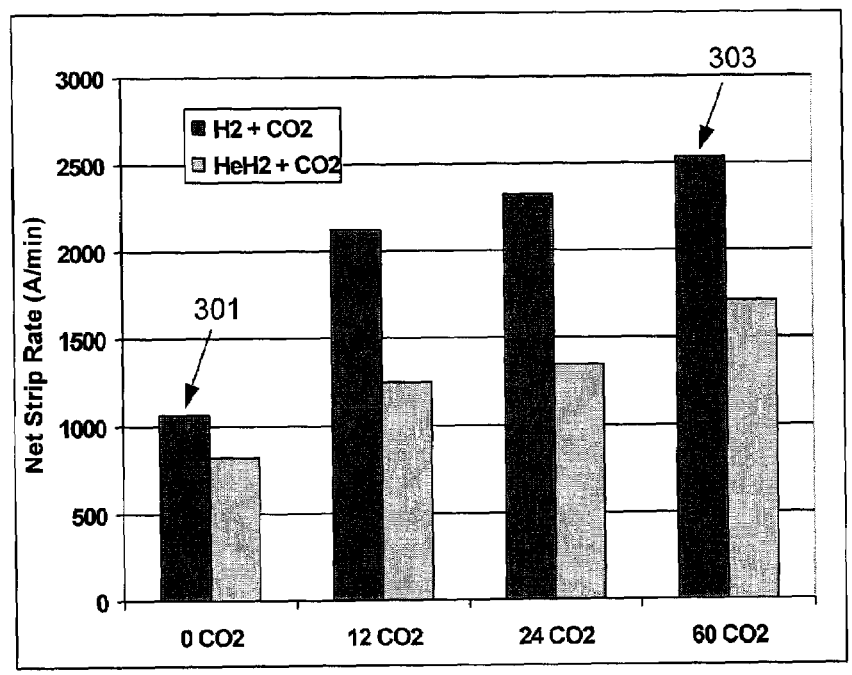
FIGS. 3A-3D are graphs showing the effects of various amounts of $CO_2$ in plasma on the photoresist strip rate and change in dielectric constant of underlying low-k dielectric film.
Figure 3B:
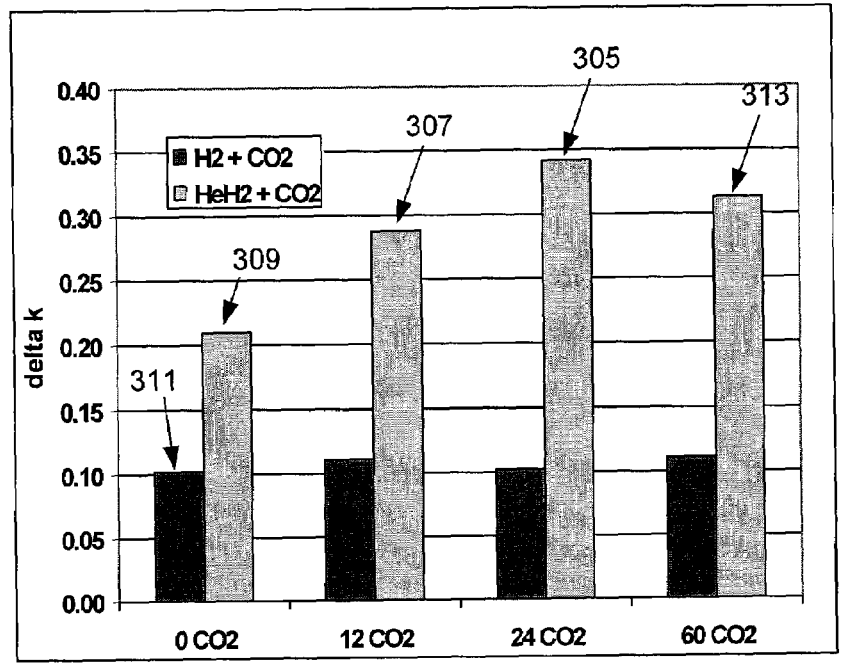

FIGS. 3A and 3B are graphs representing the net photoresist strip rate (in Angstroms per minute) and change in dielectric constant (delta k) of eight different wafers processed using different amounts of $CO_2$. The different amounts of $CO_2$ were 0 sccm (0%), 12 sccm (0.1%), 24 sccm (0.2%) and 60 sccm (0.5%). Four wafers were processed using plasmas produced with pure $H_2$ and $CO_2$ (indicated with darker bars) and four wafers were processed using plasmas produced with a 4.0% $H_2$ in Helium mixture (He/$H_2$) and $CO_2$ (indicated with lighter bars). Process conditions used for all eight wafers were: 280 C platen temperature, 13,000 sccm total gas flow rate, 1,300 Watts RF plasma power, 1,000 mTorr reaction chamber pressure, and 30 seconds plasma exposure time. All wafer samples began with about 12,000 Angstroms of photoresist for partial removal.

FIG. 3A shows that the strip rate increases with increasing amounts of $CO_2$ added in the plasma. For example, only about 1,000 Angstroms of photoresist was removed using 0 sccm of $CO_2$ (indicated by 301) compared to about 2,500 Angstroms removed using 60 sccm of $CO_2$ (indicated by 303). This result is not surprising since the addition of more $CO_2$ adds a more oxidizing component to the plasma. Also note that the strip rate of wafer samples stripped using $H_2$ and $CO_2$ was somewhat faster than those stripped using He/$H_2$ and $CO_2$. For instance, wafers processed using 12 sccm, 24 sccm and 60 sccm of $CO_2$ in pure $H_2$ had strip rates between 2,000 and 2,600 Angstroms while those wafers processed using 12 sccm, 24 sccm and 60 sccm of $CO_2$ in He/$H_2$ mixture had strip rates between about 1,200 and 1,700 Angstroms. Thus, to maximize strip rate it may be preferable to use CO in pure $H_2$ rather than He/$H_2$ mix. Note, however, as mentioned previously that for shipment and handling safety reasons, commercial hydrogen is sometimes only available in mixtures with noble gases such as helium.

FIG. 3B shows increasing amounts of $CO_2$ added in the plasma can affect the dielectric constant (reported in increasing dielectric constant, that i.e., delta k) of the underlying low-k dielectric. For all samples using a pure $H_2$ and $CO_2$ (darker bars), the increase in dielectric constant stayed around 0.10 with the addition of $CO_2$ having no significant additional effect in increasing the k value. For samples using a He/$H_2$ mixture and $CO_2$ (lighter bars), however, there did seem to be additional effect on increasing k value with increasing amounts of $CO_2$. For example, delta k of the wafer processed with 24 sccm $CO_2$ (indicated by 305) was about 0.34 compared to delta k of about 0.28 and 0.21 for wafers processed with 12 sccm and 0 sccm $CO_2$ (indicated by 307 and 309, respectively). Note, however, that even wafer 309 processed with no $CO_2$ had a higher delta k than the wafer processed with pure $H_2$ with no $CO_2$ (indicated by 311). Also note that the wafer processed with 60 sccm $CO_2$ (indicated by 313) had a delta k around 0.31, which is less than the delta k of the 24 sccm $CO_2$ 305 sample. Although not wishing to be bound by theory, it is believed that hydrogen radicals reduce carbon-carbon bonds of relatively large organic polymers of the photoresist to generate smaller organic molecules which can be easily desorbed from the wafer surface. Since hydrogen radicals are relatively long-lived and relatively highly excited (19.82 eV) they may damage low k materials through Penning ionization. Therefore, the effects of using diluted $H_2$ in place of pure $H_2$ may play a greater role at increasing the k value than the addition of $CO_2$.

Figure 3C:
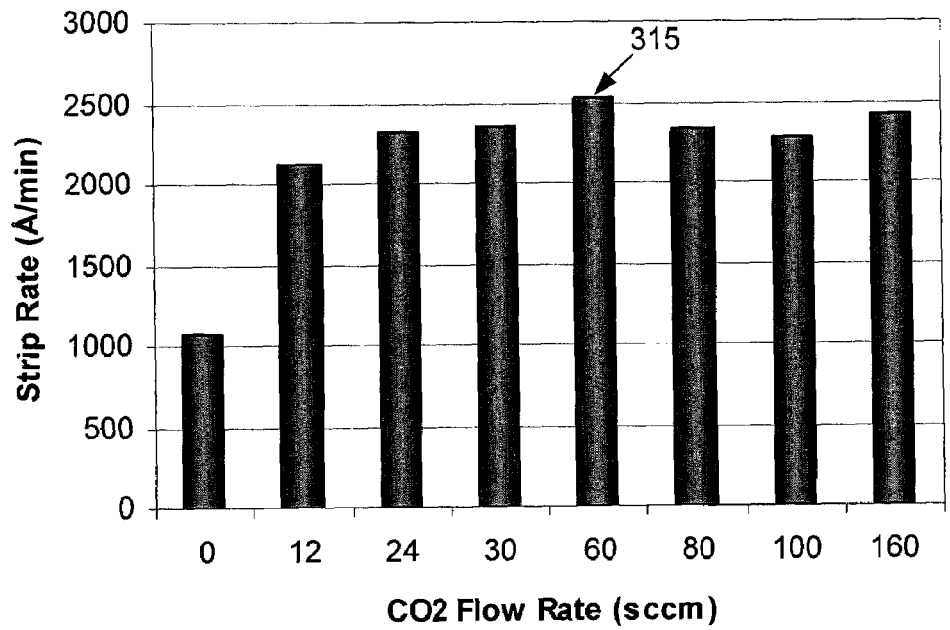
Figure 3D:
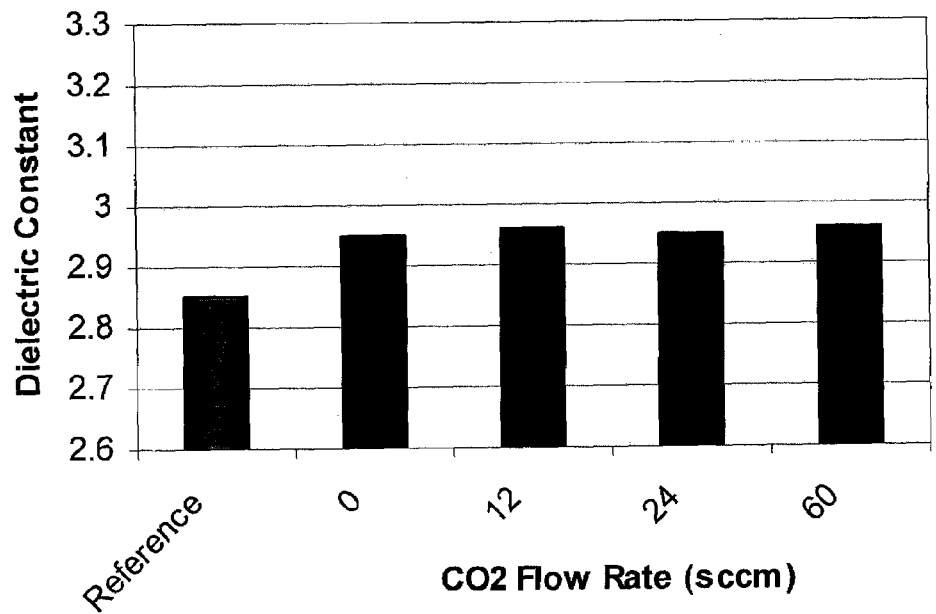

FIGS. 3C and 3D are more graphs representing the effects of increasing the amounts of $CO_2$ on the photoresist strip rate and change in dielectric constant. The wafer samples were processed using different amounts of $CO_2$ in pure $H_2$ (i.e., no dilution gas). The following process conditions were used: 280 C platen temperature, 13,000 sccm total gas flow rate, 1,300 Watts RF plasma power, 1,000 mTorr reaction chamber pressure, and 30 seconds plasma exposure time per stage.

FIG. 3C shows the net strip rate for eight wafers processed with 0 sccm (0%), 12 sccm (0.1%), 24 sccm (0.2%), 30 sccm (0.3%), 60 sccm (0.5%), 80 sccm (0.6%), 100 sccm (0.8%) and 160 sccm (1.2%) $CO_2$ in pure $H_2$. All wafers processed with some amount of $CO_2$ showed marked strip rate improvements over the wafer processed with 0% $CO_2$. In particular, the wafer processed with 160 sccm (1.2%) $CO_2$ (indicated by 315) was found to have a strip rate of over 2,500 Angstroms/minute—an increase of over two-fold over the wafer processed with no $CO_2$.

FIG. 3D, like the pure $H_2$ wafer sample data of FIG. 3B, shows that the addition of $CO_2$ does not significantly increase the k value of the dielectric constant. The "Reference" wafer refers to a wafer a Coral™ dielectric sample without photoresist and without any subsequent plasma processing. The data of FIG. 3D shows that plasma processing, with or without $CO_2$, only increased the k value slightly from the unprocessed "Reference" wafer, which had a k value of about 2.85.

Figure 3E:
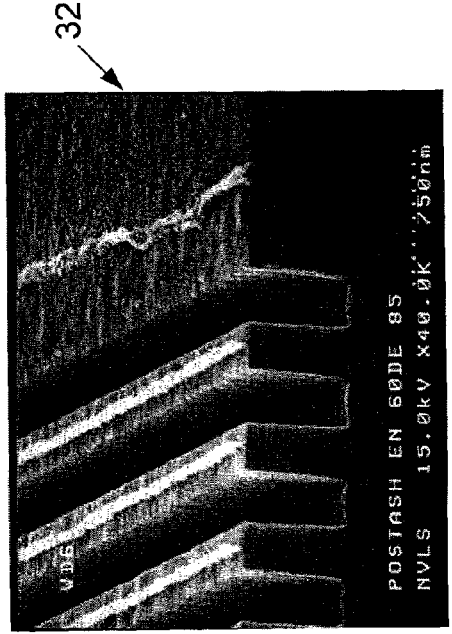
FIGS. 3E-3G are SEM images showing the effects of using $CO_2$ in plasma on wafer cleanness and feature critical dimension loss.
Figure 3E:
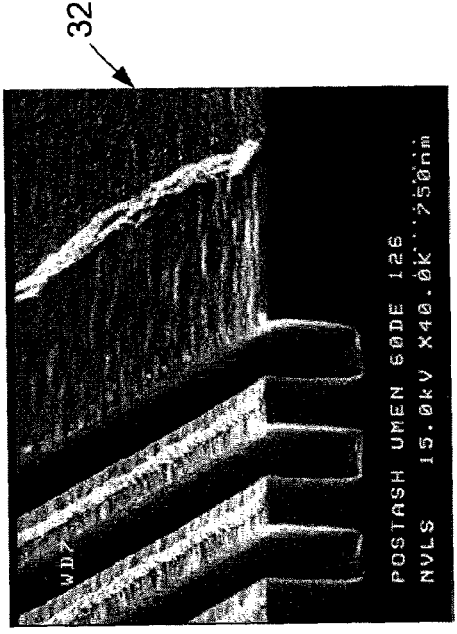
Figure 3E:
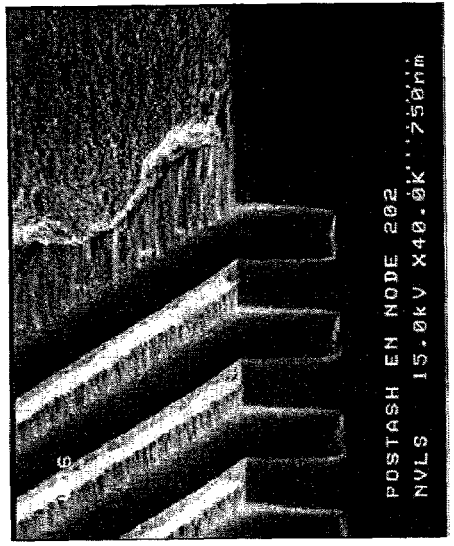
Figure 3E:
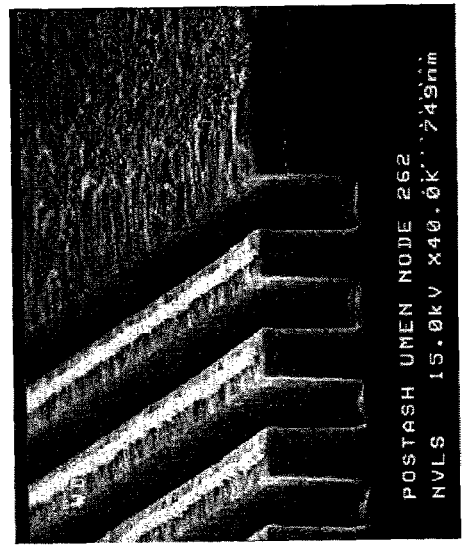
Figure 3F:
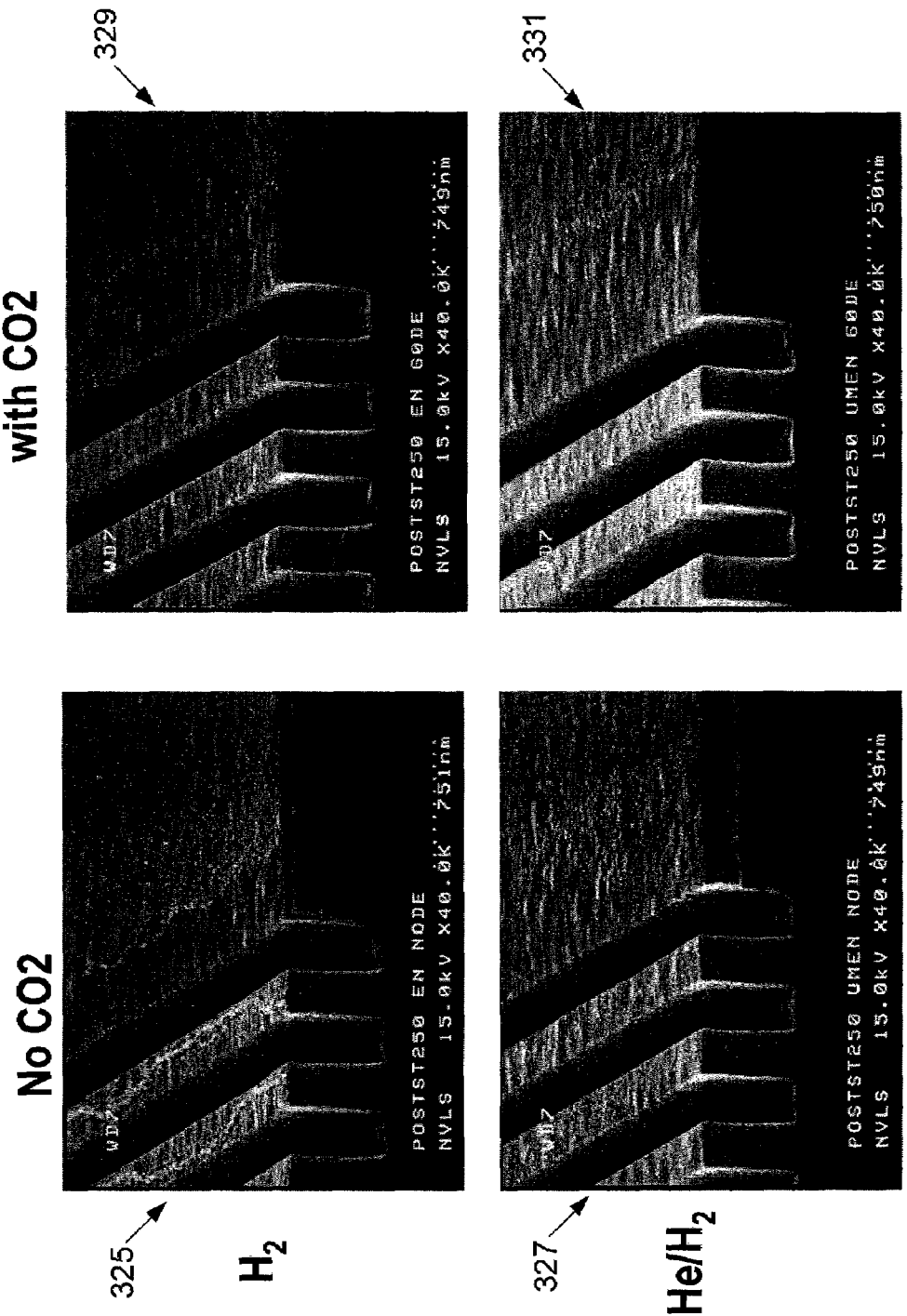
Figure 3G:
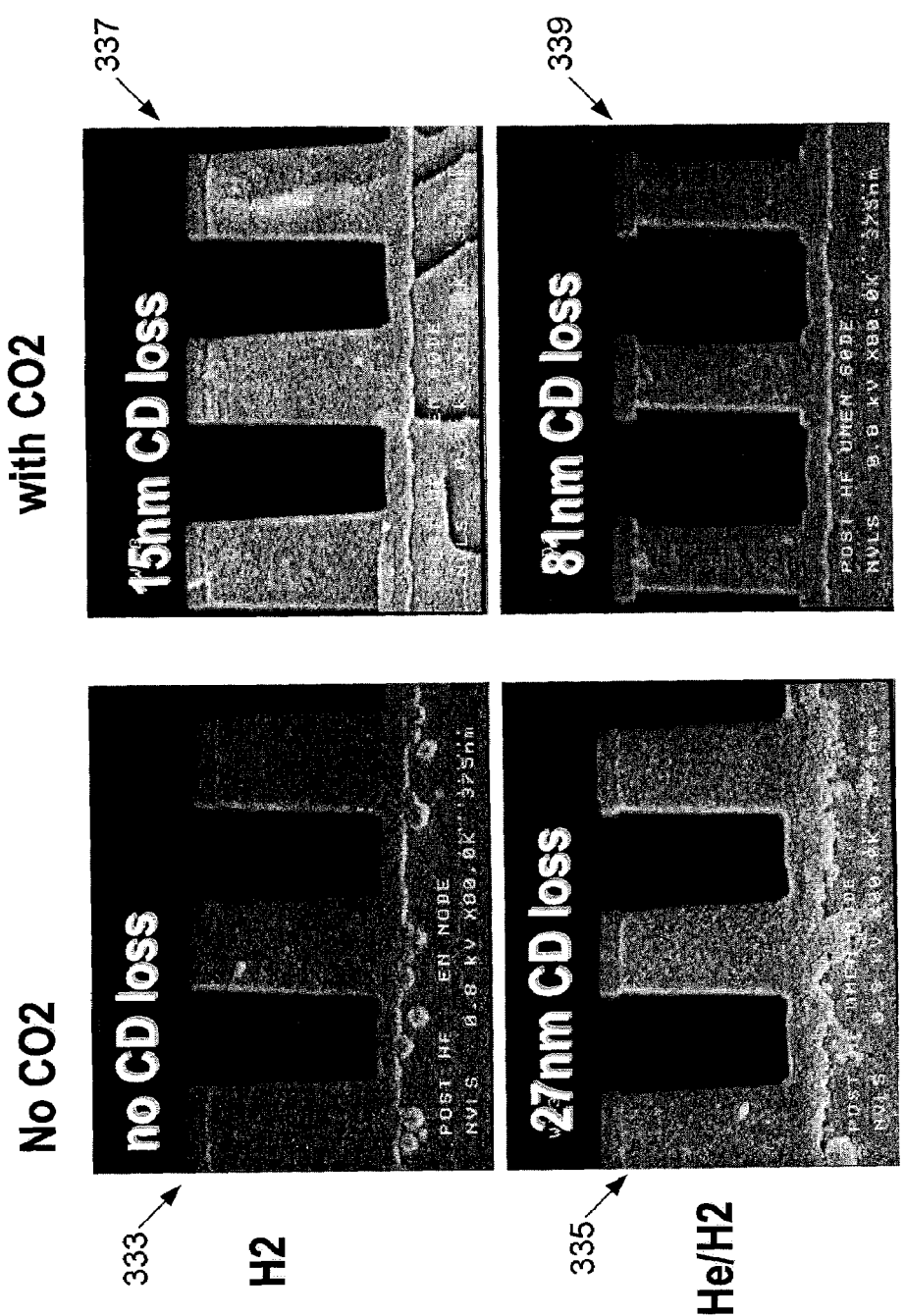

FIGS. 3E through 3G show scanning electron microscopy (SEM) images of trench structures in Coral™ low-k dielectric of a single Damascene device. FIGS. 3E and 3F illustrate how methods of the invention can be used to effectively clean the wafer surface from photoresist and etch-related residues.

FIG. 3E shows four images of devices processed with a plasma photoresist strip process without a post-wet clean process. Device 317 was processed using a pure $H_2$ plasma with no $CO_2$, device 319 was processed using a He/$H_2$ (4.0% $H_2$) plasma with no $CO_2$, device 321 was processed using a pure $H_2$ with 0.5% $CO_2$ plasma, and device 323 was processed using a He/$H_2$ (4.0% $H_2$) plasma with 0.5% $CO_2$. The following other process conditions were used: 285 C platen temperature, 13,000 sccm total gas flow rate, 1,300 Watts RF plasma power, 1,000 mTorr reaction chamber pressure, and 30 seconds per stage plasma exposure time. All samples started with about 4,000 Angstroms of photoresist. The images of FIG. 3E show that all samples (317, 319, 321 and 323) had similar in amounts of residue remaining after plasma strip processing regardless of whether $CO_2$ was used or not. Thus, in all cases, it is preferable to implement a post-strip clean process on these particular devices.

FIG. 3F shows four images of devices (325, 327, 329, 331) that had undergone the same strip processes as those of FIG. 3E and have additionally undergone a post-strip wet clean process. The post-strip wet clean process involved the use of a commercially available aqueous-based solution for post etch wet clean. After such a wet clean, it was found the samples that were previously stripped using $CO_2$ containing plasmas (329 and 331) were somewhat cleaner than those samples stripped without $CO_2$ containing plasmas (325 and 327). Thus, the use of $CO_2$ in the stripping process may aid in the cleanliness of wafer after a post-strip wet clean process.

FIG. 3G shows four SEM images of cross-sections of trench structures similar to those of FIGS. 3E and 3F after photoresist stripping, wet cleaning and a dilute HF (hydrogen fluoride) dip. This HF dip is not a normally implemented process using in device manufacturing but is used on these samples to illustrate the amounts of critical dimension (CD) loss due to carbon depletion from the sidewalls of the dielectric trench features. That is, after the HF dip, the carbon-depleted areas of the low-k film are etched and dissolved away by the strong HF acid treatment, leaving the carbon-rich low-k areas intact. Device 333 was stripped using a pure $H_2$ plasma with no $CO_2$, device 335 was processed using a $He/H_2$ (4.0% $H_2$) plasma with no $CO_2$, device 337 was processed using a pure $H_2$ with 0.5% $CO_2$ plasma, and device 339 was processed using a $He/H_2$ (4.0% $H_2$) plasma with 0.5% $CO_2$. The images of devices 333 and 335, which were stripped without $CO_2$, showed very little carbon depletion. This is not surprising since the plasma strip treatment did not contain any oxidizing agent to scavenge the carbon from the low-k film. The image of device 339, which was stripped using $He/H_2$ (4.0% $H_2$) plasma with 0.5% $CO_2$ showed some carbon depletion and sidewall damages, illustrated by the narrowed low-k columns between trenches. Note, however, that the image of device 337, which was stripped using pure $H_2$ plasma with 0.5% $CO_2$ showed very little carbon depletion/sidewall damage. These results show again that the undiluted $H_2$ in combination with $CO_2$ strip process is preferred.

Apparatus

Figure 4A:
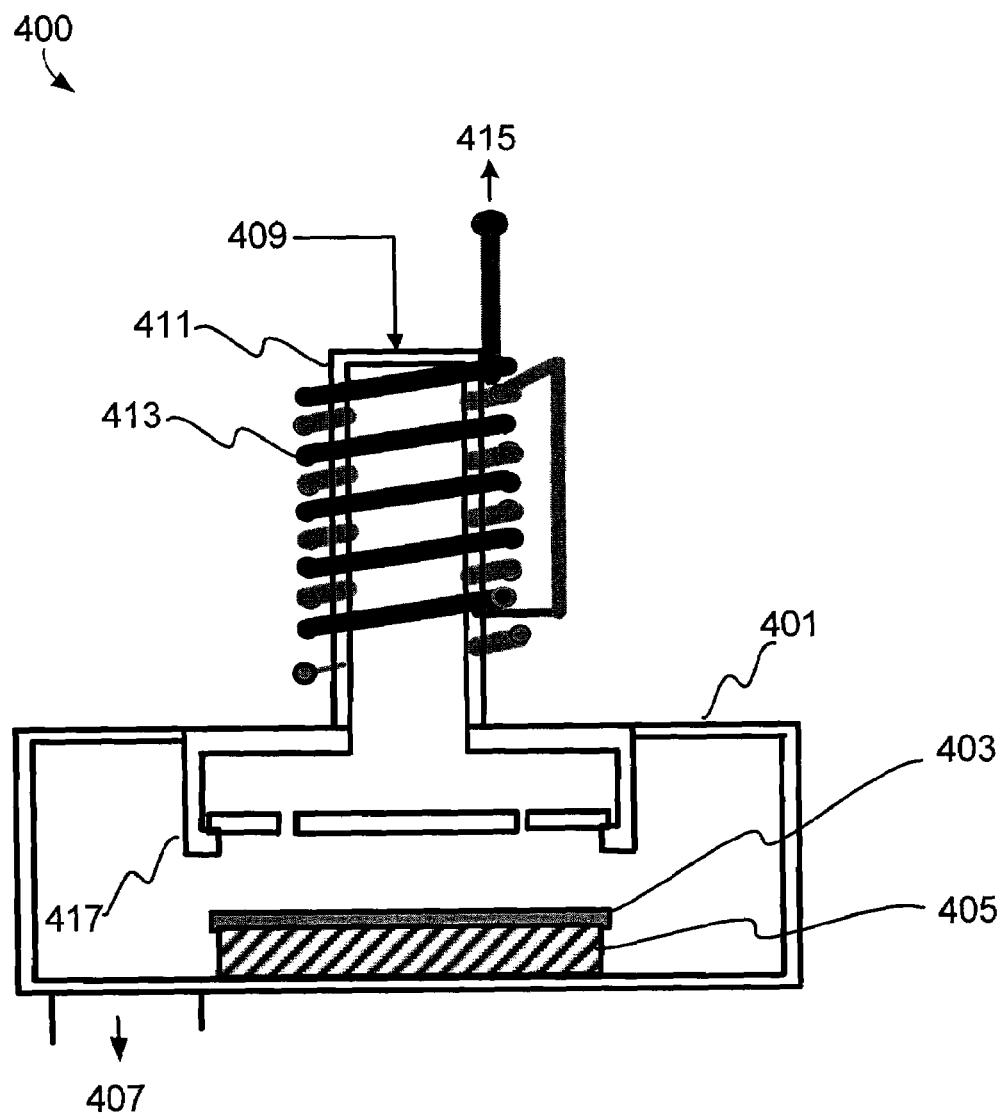
FIG. 4A is a schematic illustration showing an apparatus suitable for practicing the present invention.

As mentioned, any suitable plasma reaction chamber apparatus may be used. FIG. 4A is a schematic illustration showing aspects of a downstream plasma apparatus 400 suitable for practicing the present invention on wafers. Apparatus 400 has a plasma producing portion 411 and an exposure chamber 401 separated by a showerhead assembly 417. Inside exposure chamber 401, a wafer 403 rests on a platen (or stage) 405. Platen 405 is fitted with a heating/cooling element. In some embodiments, platen 405 is also configured for applying a bias to wafer 403. Low pressure is attained in exposure chamber 401 via vacuum pump via conduit 407. Sources of gaseous hydrogen (with or without dilution/carrier gas) and carbon dioxide (or other weak oxidizing agent) provide a flow of gas via inlet 409 into plasma producing portion 411 of the apparatus. Plasma producing portion 411 is surrounded in part by induction coils 413, which are in turn connected to a power source 415. During operation, gas mixtures are introduced into plasma producing portion 411, induction coils 413 are energized and a plasma is generated in plasma producing portion 411. Showerhead assembly 417, which has an applied voltage, terminates the flow of some ions and allows the flow of neutral species into exposure chamber 401. As mentioned, wafer 403 may be temperature controlled and/or a RF bias may be applied.

Figure 4B:
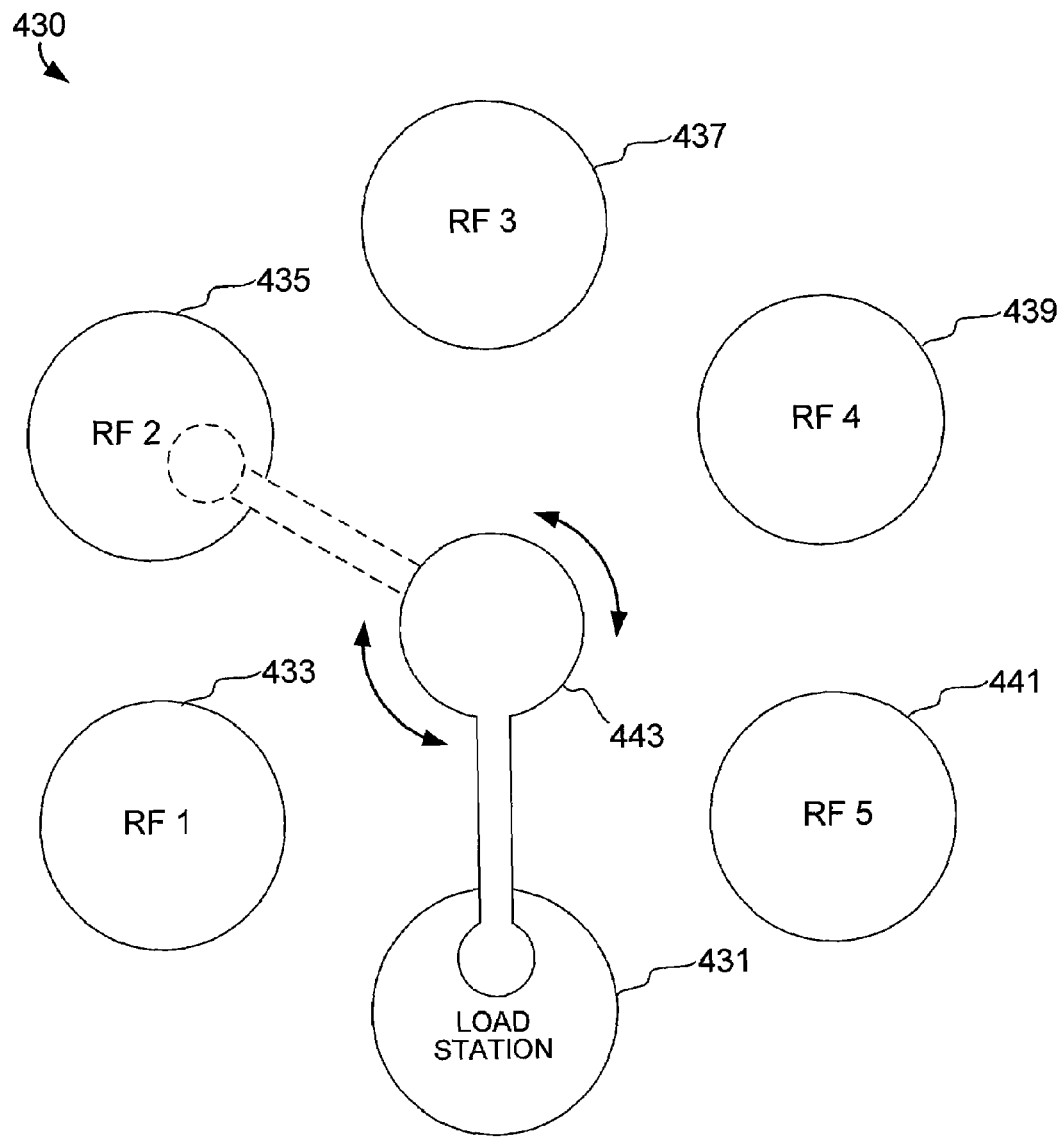
FIG. 4B is a simple block diagram showing a multi-station stripping tool suitable for practicing the present invention.

As mentioned, in some embodiments, the apparatus of the invention is a strip unit dedicated to stripping photoresist from wafers. Generally, such a strip unit tool will have multiple wafer process stations so that multiple wafers may be processes simultaneously. FIG. 4B is a simple block diagram showing a top-down view of a multi-station wafer strip unit tool 430 that may be used in accordance with the invention. Strip unit tool 430 has five strip stations 433, 435, 437, 439 and 441 and one load station 431. Strip unit tool 430 is configured such that each station is capable of processing one wafer and so all stations may be exposed to a common vacuum. Each of strip stations 433, 435, 437, 439 and 441 has its own RF power supply. Load station 431 is typically configured with a load-lock station attached thereto to allow the input of wafers into strip unit tool 430 without a break in vacuum. Load station 431 is also typically configured with a heat lamp to pre-heat wafers before transferring to strip stations and photoresist stripping. Strip station 441 is typically configured with a load-lock station attached thereto to allow the output of wafers from strip unit tool 430 without a break in vacuum. A robotic arm 443 transfers wafers from station to station.

During typical manufacturing mode, wafers are processed in batch mode. Batch mode processing can increase wafer though-put and is therefore commonly used in manufacturing operation. In batch mode, each wafer is transferred to, and processed in, each of stations 431, 433, 435, 437, 439 and 441. For example, a typical batch mode process will proceed as follows: A wafer is first loaded into load station 431 where it is preheated with a heat lamp. Next, robotic arm 443 transfers the wafer to strip station 433 where it is plasma processed for a time period sufficient to strip off about ⅕ of the photoresist. Robotic arm 443 then transfers the wafer to strip station 435 where it is plasma processed for a time period sufficient to strip off about another ⅕ of the remaining photoresist. This sequence is continued such that the wafer is processed at strip stations 437, 439 and 441. At strip station 441, the photoresist should be largely removed and wafer 441 is then unloaded from the strip unit tool.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of removing material from a dielectric layer on a partially fabricated integrated circuit in a reaction chamber, the method comprising:

developing photoresist deposited on the dielectric layer to leave exposed portions of the dielectric layer;

etching the exposed portions of the dielectric layer, thereby leaving material on at least some of the remaining portion of the dielectric layer; and after etching, exposing the partially fabricated integrated circuit to a plasma comprising species derived from hydrogen and an oxidizing agent, said oxidizing agent comprising at least one of carbon dioxide, carbon monoxide, nitrous oxide, nitric oxide, nitrogen dioxide, sulfur oxide, sulfur dioxide, and oxygen containing hydrocarbons, to thereby remove at least a portion of the material from the dielectric layer.

2. The method of claim 1, wherein the material being removed from the dielectric layer comprises photoresist and/or residues from the etch process.

3. The method of claim 1, further comprising producing the plasma by introducing a gas mixture comprising hydrogen and the oxidizing agent to the reaction chamber and exposing the mixture to conditions that form a plasma.

4. The method of claim 1 wherein introducing a gas mixture comprising hydrogen comprises introducing pure hydrogen without a carrier gas.

5. The method of claim 1, wherein the oxidizing agent comprises carbon dioxide.

6. The method of claim 1 wherein the plasma comprises between about 0.1% to about 1.0% carbon dioxide by volume.

7. The method of claim 1 wherein the plasma comprises no species derived from $O_2$ gas.

8. The method of claim 1 wherein the dielectric material is selected from one of silicon oxide based dielectric material and polymeric dielectric material.

9. The method of claim 1 further comprising, after etching the exposed portions of the dielectric layer and prior to exposing the partially fabricated integrated circuit to a plasma, introducing the partially fabricated integrated circuit to the reaction chamber.

10. A method of removing photoresist material from a dielectric layer in a reaction chamber comprising:

providing a partially fabricated integrated circuit having regions of exposed copper and regions of dielectric material having photoresist disposed thereon to a reaction chamber; and exposing the partially fabricated integrated circuit having regions of exposed copper and regions of dielectric material having photoresist disposed thereon to a hydrogen-based plasma containing species derived from an oxidizing agent selected from carbon dioxide, carbon monoxide, nitrous oxide, nitric oxide, nitrogen dioxide, sulfur oxide, sulfur dioxide, and oxygen containing hydrocarbons, thereby removing at least some of the photoresist material from the dielectric material.

11. The method of claim 10, wherein the partially fabricated integrated circuit provided to the reaction chamber comprises etch residues on the exposed copper and/or dielectric material.

12. The method of claim 10, further comprising generating the hydrogen-plasma by applying a RF power to a mixture of hydrogen and the oxidizing agent.

13. The method of claim 12, wherein the plasma is generated downstream of the reaction chamber.

14. The method of claim 12, wherein the plasma is generated in situ in the reaction chamber.

15. The method of claim 10, wherein the reaction chamber is a multi-station strip reaction chamber and exposing the partially fabricated integrated circuit to the plasma comprises exposing the partially fabricated integrated circuit to a plasma in each of the multiple stations of the reaction chamber to remove a portion of the material in each station.

16. A method of forming a low-k Damascene device, comprising:

providing dielectric material on a copper layer;

providing patterned photoresist on the dielectric material such that regions of the dielectric material to be etched are exposed;

etching the exposed portions of the dielectric material to form a via and/or trench in the dielectric material; and stripping the patterned photoresist from the dielectric material by exposing the photoresist a plasma containing hydrogen and an oxidizing agent selected from at least one of carbon dioxide, carbon monoxide, nitrous oxide, nitric oxide, nitrogen dioxide, sulfur oxide, sulfur dioxide, and oxygen containing hydrocarbons.

17. The method of claim 16 further comprising depositing a diffusion barrier on the portions of the copper layer exposed in the etch operation.

18. A method of removing photoresist and/or etch-related material from an etched dielectric material comprising exposing etched dielectric material with photoresist provided thereon to a hydrogen-based plasma containing species derived from oxidizing agent selected from carbon dioxide, carbon monoxide, nitrous oxide, nitric oxide, nitrogen dioxide, sulfur oxide, sulfur dioxide, and oxygen containing hydrocarbons.

19. The method of claim 16, wherein the oxidizing agent comprises carbon dioxide.

20. The method of claim 16 wherein the plasma comprises between about 0.1% to about 1.0% carbon dioxide by volume.

* * * * *